United States Patent
Fang

(10) Patent No.: US 11,600,465 B2
(45) Date of Patent: Mar. 7, 2023

(54) ATOMIC-SCALE PROCESSING METHOD BY COMBINING EXTREME ULTRAVIOLET LIGHT AND PLASMA

(71) Applicant: TIANJIN UNIVERSITY, Tianjin (CN)

(72) Inventor: Fengzhou Fang, Tianjin (CN)

(73) Assignee: TIANJIN UNIVERSITY, Tianjin (CN)

( * ) Notice: Subject to any disclaimer, the term of this patent is extended or adjusted under 35 U.S.C. 154(b) by 0 days.

(21) Appl. No.: 17/854,112

(22) Filed: Jun. 30, 2022

(65) Prior Publication Data
US 2022/0336189 A1    Oct. 20, 2022

Related U.S. Application Data

(63) Continuation of application No. PCT/CN2020/131669, filed on Nov. 26, 2020.

(30) Foreign Application Priority Data

Aug. 12, 2020 (CN) ......................... 202010804942.0

(51) Int. Cl.
H01L 21/3065 (2006.01)
H01J 37/32 (2006.01)

(52) U.S. Cl.
CPC ... *H01J 37/32009* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 2017/0170036 A1* | 6/2017 | Fischer | H01J 37/32972 |
| 2017/0316949 A1 | 11/2017 | Yeom et al. | |
| 2020/0142327 A1 | 5/2020 | Roozeboom et al. | |

FOREIGN PATENT DOCUMENTS

| | | | |
|---|---|---|---|
| CN | 2550376 | Y | 5/2003 |
| CN | 1473952 | A | 2/2004 |
| CN | 104716007 | A | 6/2015 |
| CN | 105762060 | A | 7/2016 |
| CN | 106370645 | A | 2/2017 |
| CN | 106877176 | A | 6/2017 |
| CN | 109841493 | A | 6/2019 |
| CN | 109904056 | A | 6/2019 |
| CN | 110047737 | A | 7/2019 |
| CN | 110491754 | A | 11/2019 |
| CN | 110880446 | A | 3/2020 |
| CN | 111463122 | A | 7/2020 |
| WO | 2018148424 | A1 | 8/2018 |

OTHER PUBLICATIONS

International Search Report of PCT/CN2020/131669, dated Apr. 28, 2021.

* cited by examiner

*Primary Examiner* — Roberts P Culbert

(57) ABSTRACT

Disclosed is an atomic-scale processing method by combining extreme ultraviolet light and plasma. The method includes synergistically applying extreme ultraviolet (EUV) light and plasma to treat a surface of a material, enabling atomic-scale processing of the surface of the material.

2 Claims, 2 Drawing Sheets

Atomic-level flat surface    EUV light excitation

Result after processing    Plasma removal

ATOMIC-SCALE PROCESSING METHOD BY COMBINING EXTREME ULTRAVIOLET LIGHT AND PLASMA

CROSS REFERENCE

The present application is a continuation-application of International (PCT) Patent Application No. PCT/CN2020/131669, filed on Nov. 26, 2020, which claims priority of Chinese Patent Application No. 202010804942.0, filed on Aug. 12, 2020, in the China National Intellectual Property Administration, the entire contents of which are hereby incorporated by reference in its entirety.

TECHNICAL FIELD

The present disclosure belongs to the field of atomic and close-to-atomic scale manufacturing and relates to extreme ultraviolet light technology and plasma etching technology, in particular to an atomic-scale processing method by combining extreme ultraviolet light and plasma.

BACKGROUND

The performance of components in high-tech fields such as information, energy and materials depends on their precision, and the realization of high precision requires advanced manufacturing technologies. Taking integrated circuit chips as an example, the number of transistors per unit area has been growing in accordance with Moore's Law since the 1970s, which is inseparable from the development of manufacturing technologies such as photolithography, ultra-precision machining and measurement. With the development of line width from the current 7 nm, 5 nm, to 3 nm and even smaller, the urgent need for manufacturing technologies with atomic and close-to-atomic level precision has become a natural consequence. Whether next-generation chips are based on quantum effects, photonics, biomolecular interactions, or other operating principles, the ability to add, subtract, or transfer materials at a controllable atomic scale with high efficiency for mass production is the key problem and challenge for manufacturing technologies.

While some of the existing laboratory techniques for atomic and close-to-atomic scale manipulation, such as scanning tunneling microscopy, atomic force microscopy, and scanning transmission electron microscopy, can be used to manipulate individual atoms, their extremely low efficiency prevents them from being ideal solutions for product manufacturing. For example, quantum chips require the distribution of quantum dots on an atomically flat stepped surface, and the extremely long time and resulting stability issues are unacceptable if such surface is obtained by removing atoms individually only. Therefore, mature atomic-scale manufacturing methods have not yet emerged.

Optical processing is another important class of micro and nano fabrication method and is expected to evolve into the atomic and close-to-atomic scale manufacturing techniques with high efficiency and environmental friendliness more suitable for future manufacturing. Material removal with atomic-level precision is theoretically possible as long as the effective range of action of the incident beam can be limited to the atomic layer scale. Extreme ultraviolet (EUV) light is strongly absorbed in all materials, and energy deposition occurs only at the topmost surface; further, since the single photon energy of EUV is higher than the typical value of chemical bonding energy, the EUV light can significantly change the electronic state or even directly break chemical bonds, thereby effectively suppressing the thermal effects that accompany the material removal during conventional laser processing, making it a potentially ideal waveband for atomic-scale processing. However, factors such as the stability of the light source and differences in the local environment of the material atoms may have an impact on the selectivity of the processing (e.g., planning to remove one layer of atoms, while multiple layers are actually removed). Therefore, the introduction of a self-limiting mechanism may effectively improve the ultimate accuracy and controllability of the EUV atomic layer processing technology.

SUMMARY OF THE DISCLOSURE

The purpose of the present disclosure is to overcome the deficiencies of the prior art, and to provide a composite atomic-scale processing method of EUV light and plasma, which utilizes the synergistic effect of EUV photons and plasma active particles to activate or modify the topmost surface of the material to be processed. By matching the parameters of the EUV light field and the plasma beam, the bonding energy difference between atoms on the surface layer and inside the material is increased, thereby improving the selectivity and process flexibility of atomic layer removal.

A technical solution provided by the present disclosure is to propose an atomic-scale processing method by combining extreme ultraviolet light and plasma, comprising: synergistically applying extreme ultraviolet (EUV) light and plasma to treat a surface of a material, enabling atomic-scale processing of the surface of the material.

In a first mode, the surface of the material is first irradiated with the EUV light so that the bonding energy between excited surface atoms is less than a bulk bonding energy inside the material, and the excited surface atoms are removed by bombardment with plasma particles; an incident ion energy is controlled so that the energy delivered to target atoms is between the bulk bonding energy and the bonding energy of the surface of the material in an excited state.

In a second mode, highly chemically active plasma particles are first adsorbed on the surface of the material to reduce atomic bonding energy, and an irradiation with the EUV light is performed; power and time of the irradiation with the EUV light are controlled so that a photon absorption energy per unit area is between the atomic bonding energy densities of the bulk material and the surface modified region.

In a third mode, highly chemically active plasma particles are first adsorbed on the surface of the material to reduce atomic bonding energy, and an irradiation with the EUV light and a low-energy plasma bombardment are performed simultaneously. Large-scale atomic emission occurs only when the EUV light and incident ions act simultaneously on the modified surface, and the total energy of the joint action is less than the bulk bonding energy.

The surface of the material is treated to a sub-nanometer flat surface prior to processing.

The advantages and positive effects of the present disclosure are as followed.

The present disclosure proposes an extreme ultraviolet light and plasma composite atomic layer processing method. Compared with traditional optical processing, the change of surface atomic bonding energy introduces a self-limiting mechanism, which improves the selectivity and controllability of atomic layer removal. Compared with atomic layer etching technology, Mode 1 uses EUV light instead of chemical adsorption for surface activation, which broadens the versatility of materials and improves efficiency; Mode 2 uses EUV light instead of plasma bombardment for material removal, such that the possibility of introducing impurity elements is avoided; in addition, since a large number of photons with the same state can coexist (bosons), a very low degree of energy dispersion (i.e., high monochromaticity) can be achieved, and the processing certainty can be improved; Mode 3 adds an EUV enhancement excitation link to the classical plasma atomic layer etching, so that the material removal caused by ion bombardment alone is transformed into a joint action of EUV and ion bombardment, which can effectively reduce the incident ion energy and processed surface damage.

DETAILED DESCRIPTION

The present disclosure will be further described in detail below with reference to the accompanying drawings and specific embodiments. The following embodiments are only descriptive, not restrictive, and cannot limit the scope of the present disclosure.

The key to improving the selectivity and controllability of atomic layer removal is to reduce the bonding energy between atoms on a surface of the material, and further to control the action energy of the removal process to be between the surface bonding energy and the bulk bonding energy. According to this idea, three processing modes are proposed:

Mode 1: EUV Activation—Plasma Removal

Figure 1:
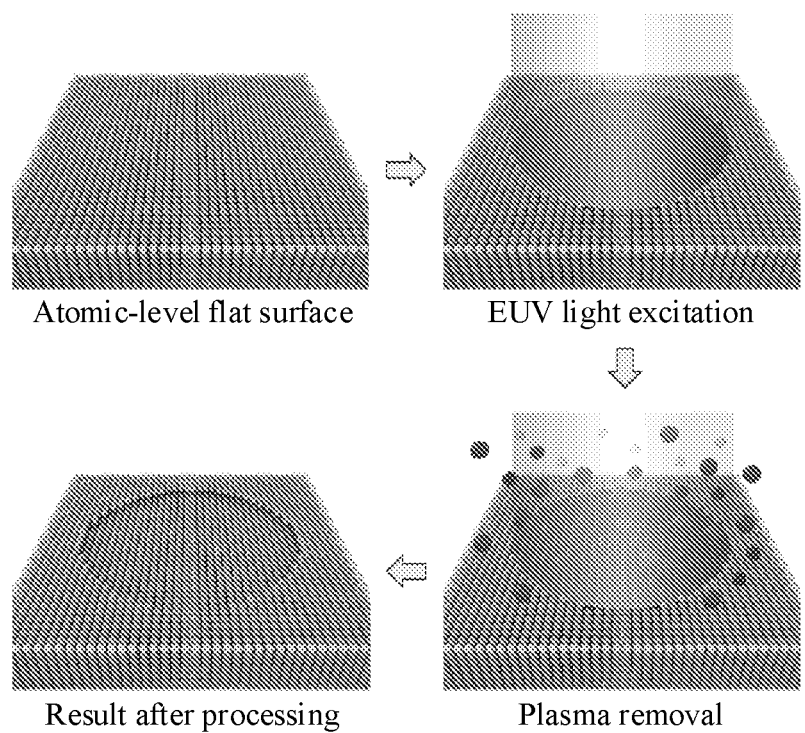
FIG. 1 is a flowchart of EUV activation-plasma removal process of Mode 1.

The surface of the material is first irradiated with EUV light, and surface electrons absorb photons and are raised to a high-energy state. At the same time, the irradiation power and time are controlled to avoid large-scale atomic emission. In this case, the bonding energy between the excited surface atoms is lower than the bulk bonding energy inside the material. The activated atoms are removed by bombardment with plasma particles, and the incident energy of the ions is controlled so that the energy transmitted to the target atoms is between the excited state bonding energy and the bulk bonding energy in the surface layer of the material. Since the time scale of photoexcitation is on the order of femtoseconds to picoseconds, the EUV light source and the plasma beam can be turned on simultaneously. In this mode, EUV light is configured to reduce the surface atomic bonding energy, plasma bombardment is configured for selective atomic layer removal, and large-scale atomic removal occurs only in a region where EUV light and plasma coexist. The removal process slows down significantly or even disappears under only one external field condition. The corresponding main steps are as follows (FIG. 1):

(1) Determining EUV Exposure Parameters.

Assuming that the atomic bonding energy per unit volume of the material to be processed is $\varepsilon_G$, the distance between the atomic layers corresponding to the processed surface is d, the number of atomic layers to be removed is N, and the atomic bonding energy per unit volume in the activated state is $\varepsilon_E$, then the energy to be absorbed per unit area on the material surface is:

$$E_{abs}=(\varepsilon_G-\varepsilon_E)Nd \quad (1)$$

When the irradiation power is P and the spot area is S, the corresponding irradiation time τ is:

$$\tau=SE_{abs}/P \quad (2)$$

Based on the above initial values, the wavelength of the light source, the pulse width, and the properties of the material to be processed, a numerical simulation model is established, and the irradiation power and time are corrected by using the results of simulation based on molecular dynamics or quantum mechanics.

(2) Determining Plasma Bombardment Parameters.

Assuming that the number of chemical bonds in the unit volume of the material to be processed is n, the energy initial value $E_{ion}$ of the plasma incident particle is estimated as follows:

$$\varepsilon_E/n<E_{ion}<\varepsilon_G/n \quad (3)$$

Based on the above initial value range and plasma elements, molecular dynamics or quantum mechanics are used to simulate the ion bombardment process, and the energy, dose and current intensity corresponding to the removal of only the activated atoms are determined.

(3) Pre-Processing Preparation.

A sub-nanometer flat surface of the material to be processed is obtained by mechanical machining, polishing, chemical etching, heat treatment, etc.; the EUV light path and plasma beam are adjusted according to the parameters determined in steps (1) and (2), and alignment and synchronization of the two energy beams are completed (wherein a mask may be prepared according to specific processing needs); samples are placed, a coordinate system is established, and vacuuming is performed.

(4) Simultaneously turning on EUV Beam and Plasma Beam for Atomic Layer Removal Processing.

(5) Measuring and Evaluating the Processing Result.

Mode 2: Plasma Modification—EUV Removal

Figure 2:
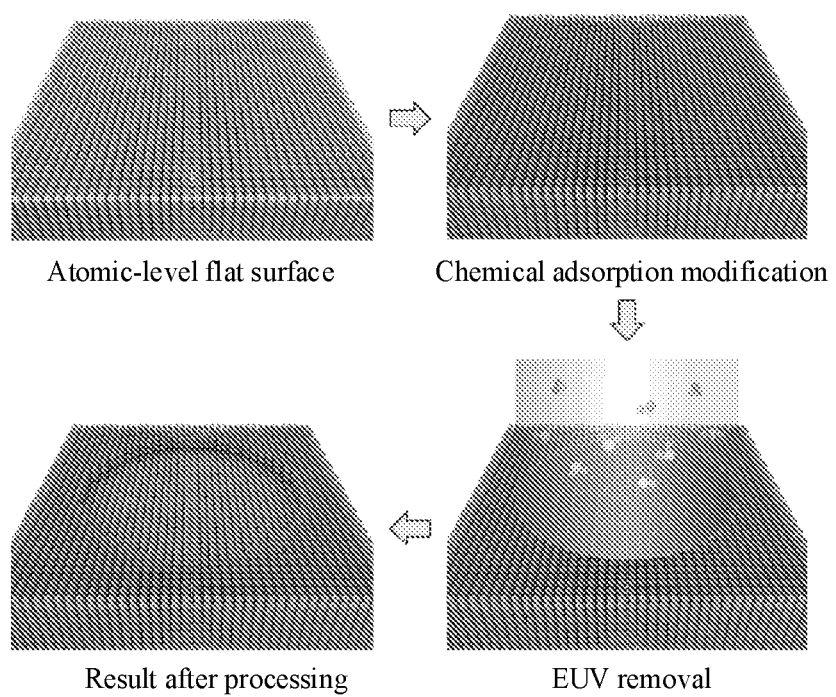
FIG. 2 is a flowchart of plasma modification-EUV removal process of Mode 2.

The highly chemically active plasma particles are firstly adsorbed on the surface of the material to change the electronic state of the topmost surface layer of the material and reduce the surface atomic bonding energy; after the adsorption process is over, EUV light is irradiated, and the irradiation power and time are controlled to make the photon absorption energy per unit area between the atomic bonding energy densities of the bulk material and the surface modified region. Since the adsorbed particles generally only have a significant effect on the electronic state of one layer of substrate atoms in direct contact with the adsorbed particles, after the two energy fields act in succession (one processing cycle), theoretically, one atomic layer will be removed. Continuous layer-by-layer removal can be achieved through multiple cycles. The role of the plasma in this mode is to achieve surface modification by chemisorption, while the selective removal of atomic layers is achieved by EUV irradiation. The corresponding main steps are as follows (FIG. 2):

(1) Determining Plasma Surface Modification Parameters.

An atomic-level model of adsorption on the surface of the material is established, interatomic binding energies of the material before and after the adsorption of specific particles are obtained by quantum mechanics or molecular dynamics simulation respectively to be $E_{G-atomic}$ and $E_{M-atomic}$, and the influence law of temperature is obtained. According to the theoretical analysis results, the plasma elements, reaction temperature and time are determined.

(2) Determining EUV Exposure Parameters.

The binding energies that need to be overcome to remove the original and modified materials per unit area and thickness of a single atomic layer are about $ndE_{G-atomic}$ and $ndE_{M-atomic}$, respectively, and the initial values of irradiation time and power for a single processing cycle may be estimated by the following equations:

$$ndE_{M-atomic} < \tau P/S < ndE_{G-atomic} \quad (4)$$

A numerical simulation model is established based on the above-mentioned initial value range, the wavelength of the light source, the pulse width, and the properties of the material to be processed, and the irradiation power and time are corrected by using the results of simulation based on molecular dynamics or quantum mechanics.

(3) Pre-Processing Preparation.

A sub-nanometer flat surface of the material to be processed is obtained by mechanical machining, polishing, chemical etching, heat treatment, etc.; the EUV light path is adjusted according to the parameters determined in step (2) (wherein a mask may be prepared according to specific processing needs); samples are placed, a coordinate system is established, and vacuuming is performed.

(4) Turning off the EUV Beam, Feeding in the Plasma According to the Parameters Determined in Step (1); and After the Reaction is Completed, Turning off the Plasma Source and Vacuuming is Performed to Remove Excess Reaction Gas.

(5) Turning on the EUV Beam for Atomic Layer Removal Process.

(6) When Multiple Processing Cycles are Required, Repeating Steps (4) and (5) to a Specified Number of Times.

(7) Removing Excess Adsorbed Particles from the Surface.

(8) Measuring and Evaluating the Processing Result.

Mode 3: EUV—Plasma Enhancement Removal

Figure 3:
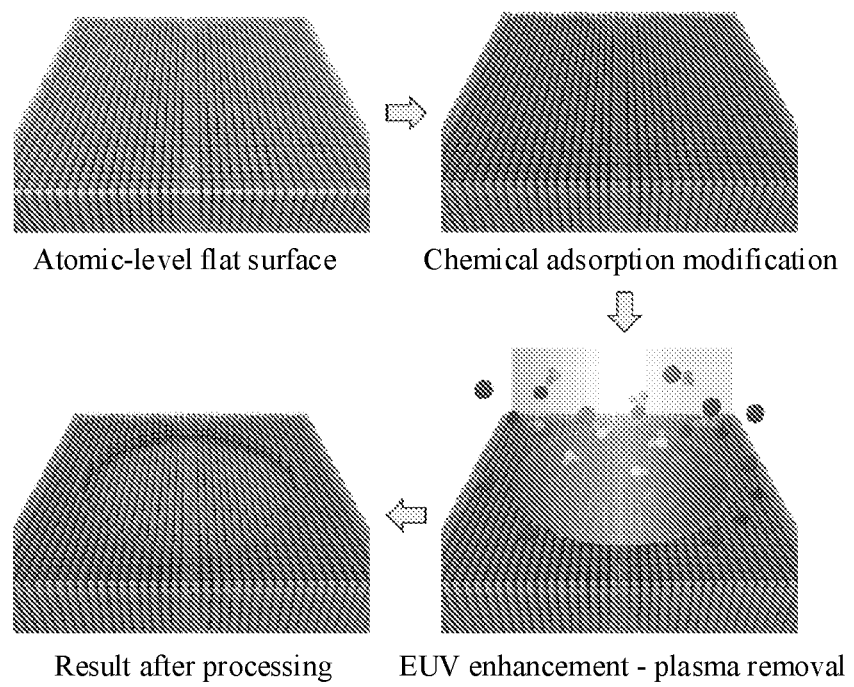
FIG. 3 is a flowchart of EUV-plasma enhancement removal process of Mode 3.

The key to suppressing the lattice damage caused by plasma bombardment is to reduce the incident ion energy, which may be achieved when the surface atomic bonding energy of the material can be further weakened and the difference between the bulk bonding energy can be increased on the basis of surface adsorption. The first step of this mode is surface adsorption modification (same as mode 2), and in the second step, EUV light is used for enhanced excitation, and low-energy plasma bombardment is used to achieve material removal. The parameters of EUV irradiation and incident ions are controlled to avoid large-scale atomic emission when the two act alone. In addition, the energy transferred by the incident ions to the target atoms is greater than the bonding energy of the enhanced excited state on the surface of the material, while the energy of the combined action of the EUV and the incident ions is less than the bulk bonding energy. In this way, large-scale atomic removal occurs only in a region where EUV light and plasma coexist, and the removal process is significantly slowed down or even disappears with only one external field condition. The corresponding main steps are as follows (FIG. 3):

(1) determining plasma surface modification parameters, same as step (1) in Mode 2.

(2) determining EUV irradiation parameters and plasma bombardment parameters.

The initial values of irradiation time, power and incident ion energy for removing single atomic layer in unit area can be estimated by the following equations:

$$ndE_{M-atomic} < \frac{\tau P}{s} + ndE_{ion} < ndE_{G-atomic} \quad (5)$$

$$\tau P/S < ndE_{M-atomic}$$

$$E_{ion} < E_{M-atomic}$$

Based on the above initial value range, the wavelength of the light source, the pulse width, the plasma elements, and the properties of the material to be processed, a numerical simulation model is established, and molecular dynamics or quantum mechanics are used to simulate the process of EUV irradiation and bombardment. The energy, dose and current intensity are accurately calculated and corrected to ensure that under the final optimized parameters, no large-scale atomic emission occurs when EUV light and ion beam exist alone, and when the two work together, only the atomic layer modified in step (1) is removed.

(3) pre-processing preparation, same as step (3) in Mode 1.

(4) plasma surface modification, same as step (4) in Mode 2.

(5) atomic layer processing, same as step (4) in Mode 1.

(6) when multiple machining cycles are required, repeating steps (4) and (5) to a specified number of times.

(7) removing excess adsorbed particles from the surface.

(8) measuring and evaluating the processing result.

The following is an example of atomic layer removal on the surface of single crystal silicon using mode 3. The specific steps are as follows:

1. determining plasma surface modification parameters.

2. determining EUV irradiation parameters and plasma bombardment parameters.

3. pre-processing preparation.

4. turning off the EUV beam, and feeding in the plasma according to the parameters determined in step 1; after the reaction is completed, turning off the plasma source and vacuuming is performed to remove excess reaction gas.

5. synchronously turning on the EUV beam and the plasma beam, and performing the atomic layer removal processing according to the parameters determined in step 2.

6. when multiple machining cycles are required, repeating steps 4 and 5 to a specified number of times.

7. removing excess adsorbed particles from the surface.

8. measuring and evaluating the processing result.

The plasma surface modification parameters mentioned in step 1 include plasma elements, reaction temperature and time; in the process of parameter design, quantum mechanics or molecular dynamics calculations may be used to obtain the bonding energy between atoms of the material before and after the adsorption of specific particles and the variation curve of the bonding energy as a function of temperature.

The EUV irradiation parameters mentioned in step 2 include wavelength, pulse width, beam spot area, power and irradiation time; plasma bombardment parameters include incident ion element, energy, dose and current intensity; in the parameter design process, quantum mechanics or molecular dynamics may be used to simulate the process of EUV irradiation and bombardment to ensure that under the final optimized parameters, no large-scale atomic emission occurs when EUV light and ion beam exist alone, and when the two act together, only the atomic layer modified in step (1) is removed.

The preliminary preparation mentioned in step 3 includes the use of mechanical machining, polishing, chemical etching, heat treatment and other methods to obtain a sub-nanometer flat surface of the material to be processed (of which the roughness Sa is less than 1 nm); according to the parameters determined in steps 1 and 2, the EUV path and plasma beam flow are determined, and the alignment and synchronization of the two energy beams are completed (wherein a mask may be prepared according to specific processing needs); samples are placed, a coordinate system is established, and vacuuming is performed ($<2\times10^{-4}$Pa).

The measurement methods mentioned in step 7 include STM, STEM, and AFM, and the evaluation indicators include atomic-scale material removal, surface roughness, and lattice deformation layer thickness.

The above are only the preferred embodiments of the present disclosure. It should be noted that for those skilled in the art, without departing from the inventive concept, several modifications and improvements can be made, which are within the scope of the present disclosure.

What is claimed is:

1. An atomic-scale processing method by combining extreme ultraviolet light and plasma composite, comprising:

synergistically applying extreme ultraviolet (EUV) light and plasma to treat a surface of a material, enabling atomic-scale processing of the surface of the material; wherein the surface of the material is first irradiated with the EUV light so that a bonding energy between excited surface atoms is less than a bulk bonding energy inside the material, and the excited surface atoms are removed by bombardment with plasma particles; an incident ion energy is controlled so that an energy delivered to target atoms is between the bulk bonding energy and the bonding energy of the surface in an excited state; the EUV light is configured to reduce an atomic bonding energy of the surface, the bombardment with plasma particles is configured for selective removal of atomic layer, and the atomic removal occurs only in a region where the EUV light and the plasma co-operate; the removal process slows down significantly or even disappears under only one external field condition; or highly chemically active plasma particles are first adsorbed on the surface of the material to reduce the atomic bonding energy of the surface, and an irradiation with the EUV light and a low-energy plasma bombardment are performed simultaneously; power and time of irradiation with the EUV light as well as an ion incident energy are controlled, so that an energy is less than the atomic bonding energy of the adsorbed-modified surface when each of the EUV light and the plasma acts alone, and a total energy is between the atomic bonding energy of the adsorbed-modified surface and the bulk bonding energy when the EUV light and the plasma act together; the atomic removal occurs only in the region where the EUV light and the plasma co-operate; the removal process slows down significantly or even disappears under only one external field condition.

2. The method according to claim 1, wherein the surface of the material is treated to a sub-nanometer flat surface prior to processing.

* * * * *